United States Patent [19]

Hosokawa et al.

[11] Patent Number: 5,361,053
[45] Date of Patent: Nov. 1, 1994

[54] SUPER MAGNETOSTRICTION TYPE ACTUATOR

[75] Inventors: Yuichi Hosokawa; Kazumitsu Kobayashi; Tomoichi Misawa, all of Atsugi, Japan

[73] Assignee: Unisia Jecs Corporation, Atsugi, Japan

[21] Appl. No.: 132,867

Related U.S. Application Data

[63] Continuation-in-part of PCT/JP93/00608, May 10, 1993.

[22] Filed: Oct. 7, 1993
[51] Int. Cl.[5] ............ H01L 41/12; H02K 35/00; H02N 2/00
[52] U.S. Cl. ............................. 335/215; 310/25
[58] Field of Search ............... 335/215; 310/26, 346, 310/347, 348; 251/129.06

[56] References Cited

U.S. PATENT DOCUMENTS 5,184,037  2/1993  Kobayashi et al. ............... 310/26

FOREIGN PATENT DOCUMENTS 63-195168  12/1988  Japan .
3-243174   2/1990   Japan .
0138986    6/1991   Japan .................... 310/26
3-206348   9/1991   Japan .
0285578   12/1991   Japan .................... 310/26
4-62983    2/1992   Japan .

Primary Examiner—Leo P. Picard
Assistant Examiner—Ramon M. Barrera
Attorney, Agent, or Firm—Foley & Lardner

[57] ABSTRACT

In a super magnetostriction type actuator constructed such that a super magnetostriction rod is extended/contracted by application of a magnetic field from a solenoid coil, and a drive object is moved in response to the extension/contraction, a locating member for locating the super magnetostriction rod thermally deforms in correspondence with a thermal expansion of the super magnetostriction rod so as to permit an extension of the super magnetostriction rod due to the thermal expansion thereof. As a result, variation in spring loading and lift with thermal expansion of the super magnetostriction rod can be avoided. Also, the magnetostriction characteristic of the locating member is opposite that of the super magnetostriction rod allowing for greater relative movement of the super magnetostriction rod upon application of a magnetic field.

5 Claims, 5 Drawing Sheets

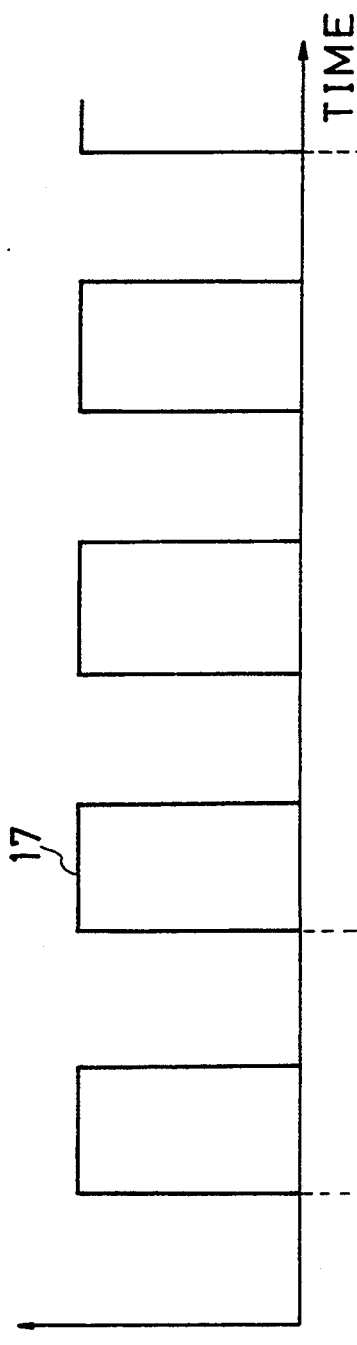
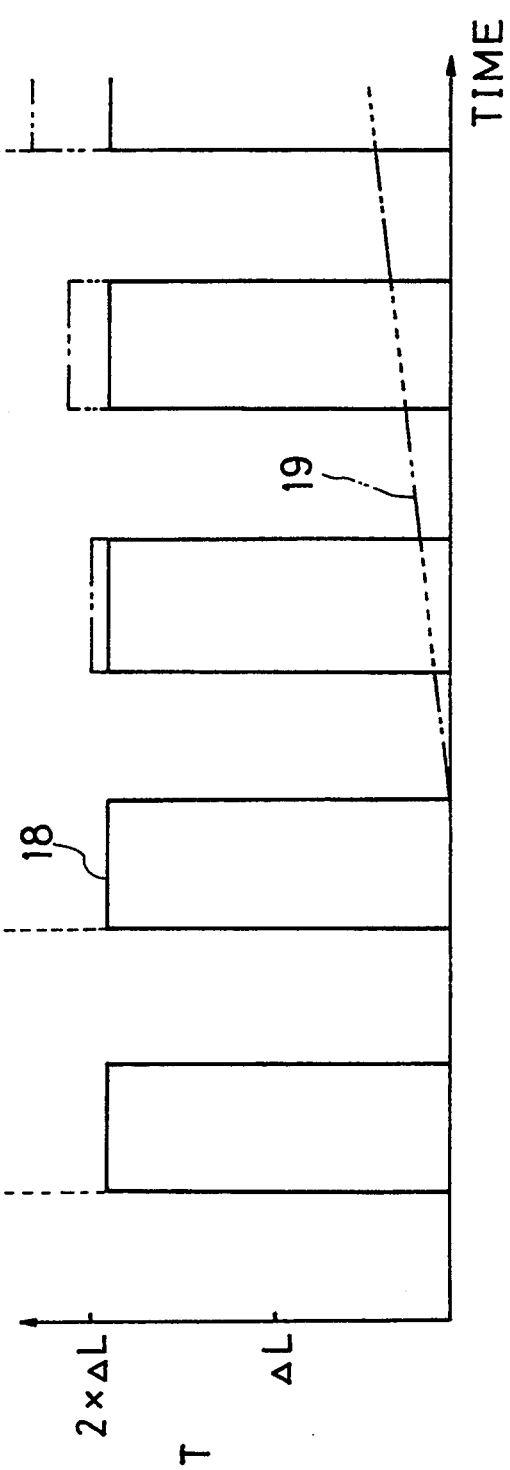

5,361,053

SUPER MAGNETOSTRICTION TYPE ACTUATOR

This application is a continuation-in-part application of Ser. No. PCT/JP93/00608, filed on May 10, 1993.

BACKGROUND OF THE INVENTION

1. Field of the Invention

The present invention relates to a super magnetostriction type actuator suitable for use in valves such as injection valves or shut off valves, and more particularly to a super magnetostriction type actuator in which changes in drive characteristics due to thermal expansion of a super magnetostriction rod can be minimized. For conciseness in the following the term super magnetostriction will be abbreviated to SMS.

2. Description of the Related Art

Generally known fuel injection valves utilizing a SMS type actuator such as those disclosed in publications of Unexamined Japanese Patent Publication No. 3-243174 and the like, comprise a cylindrical casing, a SMS rod for driving a drive object which is provided at one end of the casing, the SMS rod being housed inside the casing and extending in an axial direction thereof with one end attached to the drive object, and a solenoid coil disposed inside the casing around the SMS rod for applying a magnetic field to the SMS rod to cause an expansion or contraction thereof.

With a fuel injection valve involving this type of conventional technology, a valve seat incorporating a fuel injection port is provided at one end of the casing, with a drive object in the form of an internal opening type valve member seated thereon and urged in a normally closed direction by a valve spring. One end of the SMS rod is fixedly attached to the valve member so that when the SMS rod is contracted due to the magnetic field of the solenoid coil the valve is lifted against the resistance of the valve spring allowing fuel inside the casing to spray outwards.

The other end of the casing is provided with a cover member which abuts with an end face of the other end of the SMS rod. This cover member presses the SMS rod, together with the valve member, towards the valve seat and provides spring loading adjustment for the valve spring. Separation of the SMS rod from the cover when the rod is contracted due to the magnetic field of the coil is restrained so that the valve member can be positively lifted against the resistance of the valve spring.

With this conventional technology, the drive object in the form of a valve member is provided at one end of the casing, the cover is provided at the other end of the casing, and the SMS rod is located within the casing between the cover and the valve member. With this arrangement, when the solenoid coil provided around the SMS rod is heated by an external electrical load, the heating can cause the SMS rod to expand in an axial direction between the cover and the valve member.

If the coefficient of thermal expansion of the SMS rod is larger than that of the casing, then since the corner is fixed integral with the casing, when the SMS rod expands with heating it extends towards the valve member.

Consequently, with the conventional technology, not only is the spring load of the valve spring affected by the thermal expansion of the SMS rod, but also the lift amount of the valve member when the SMS rod is extended/contracted by the magnetic field from the solenoid valve is altered. This results in problems due to variations in injection flow rate characteristics with temperature.

Moreover, with a construction wherein the drive object is in the form of an externally opening type valve member which opens with extension of the SMS rod, the position of the valve member alters in the valve open direction with thermal expansion of the SMS rod, so that the valve member separates from the valve seat, causing problems with sealing of the valve.

SUMMARY OF THE INVENTION

In view of the abovementioned problems with the conventional technology, it is an object of the present invention to provide a SMS type actuator which cart avoid the variation in the loading of the valve spring and the variation in the lift amount of the valve member even when the SMS rod is thermally expanded, and which can minimize the occurrence of faulty sealing in an externally opening valve.

It is a further object of the present invention to provide a simple construction whereby the beforementioned variations in characteristics may be effectively avoided.

Another object of the present invention is to reduce the overall size of an actuator by amplifying the amount of positional change of the drive object with expansion/contraction of the SMS rod due to the magnetic field.

A further object of the present invention is to provide an actuator wherein the drive effected by expansion/contraction of the SMS rod is stable.

Yet another object of the present invention is to provide an actuator wherein the thermal expansion of the SMS rod as well as the thermal expansion of a drive object such as a valve member can be accommodated.

Moreover, it is an object of the present invention to provide a construction which can accommodate thermal expansion of the drive object so as to avoid a large impact received by the SMS rod during drive.

In order to address the above problems and objects, the actuator according to the present invention comprises a cylindrical casing, a SMS rod for driving a drive object which is provided at one end of the casing, the SMS rod being housed inside the casing and extending in an axial direction thereof with one end attached to the drive object, a solenoid coil disposed inside the casing around the SMS rod, for applying a magnetic field to the SMS rod to cause an expansion or contraction thereof, and a locating member for locating an other end of the SMS rod, which thermally deforms in correspondence with a thermal expansion of the SMS rod in a direction to permit extension of the SMS rod towards its other end.

As a result, when the SMS rod extends due to thermal expansion, the locating member which sets the reference point for the drive due to the expansion/contraction of the SMS rod, thermally expands in a direction which permits this extension, thereby offsetting the extension of the SMS rod due to the thermal expansion so that the drive object end of the SMS rod can be maintained at a constant location.

The locating member is preferably made in hollow cylindrical form from a material having a coefficient of thermal expansion corresponding that of the SMS rod, with a sufficient length to accommodate the axial length of the SMS rod, and constructed such that an open end of the cylinder can be fixed to the casing, while the other end can be engaged with the other end of the SMS rod so that the SMS rod is located thereby.

This construction wherein the locating member is made in hollow cylindrical form of sufficient length to accommodate the axial length of the SMS rod enables a thermal expansion in the locating member corresponding to that of the SMS rod to be easily achieved, and thus provides a simple design whereby the thermal expansion of the rod can be effectively offset.

Moreover, with the above construction, the locating member is made of a SMS material having an opposite magnetostriction characteristic to that of the SMS rod.

Hence, when the SMS rod is extended for example by a magnetic field, the locating member is contracted, and since this contraction is in the same direction as the extension of the SMS rod, the positional change of the drive object is determined by the sum of the contraction and extension.

A construction is also possible wherein an urging device is provided at the beforementioned one end of the casing, for urging the SMS rod towards the other end of the casing.

In this case, since with the abovementioned construction the drive object end of the rod is maintained at its original position even during thermal expansion, the initial load applied to the rod by the urging device can be maintained constant, so that stable drive conditions are possible.

Furthermore, with a construction wherein the drive object is driven by and in the direction of the extension of the SMS rod caused by the magnetic field, then a small gap to allow for axial thermal expansion of the drive object under non drive conditions of the SMS rod can be interposed between the drive object and the SMS rod. In such a construction, faulty drive due to thermal expansion of the drive object can be avoided.

With the above construction having the small intervening gap, a buffer member is provided between the SMS rod and the drive object. As a result, even with the small gap between the drive object and the rod, the shock received by the SMS rod from the drive object when the rod extends and drives the drive object can be sufficiently dampened.

A construction is also possible wherein the drive object is driven in an opposite direction to that of the magnetic field induced extension of the SMS rod.

Further objects and aspects of the present invention will become apparent from the following description of the embodiments with reference to the accompanying drawings.

BRIEF DESCRIPTION OF THE DRAWINGS

FIGS. 4(a) and 4(b) provide a characteristic diagram showing injection pulse and valve member lift amounts.

DESCRIPTION OF THE PREFERRED EMBODIMENTS

Descriptions of SMS type actuators according to two embodiments of the present invention in the form of injection valves are given below with reference to FIGS. 1-5.

Figure 1:
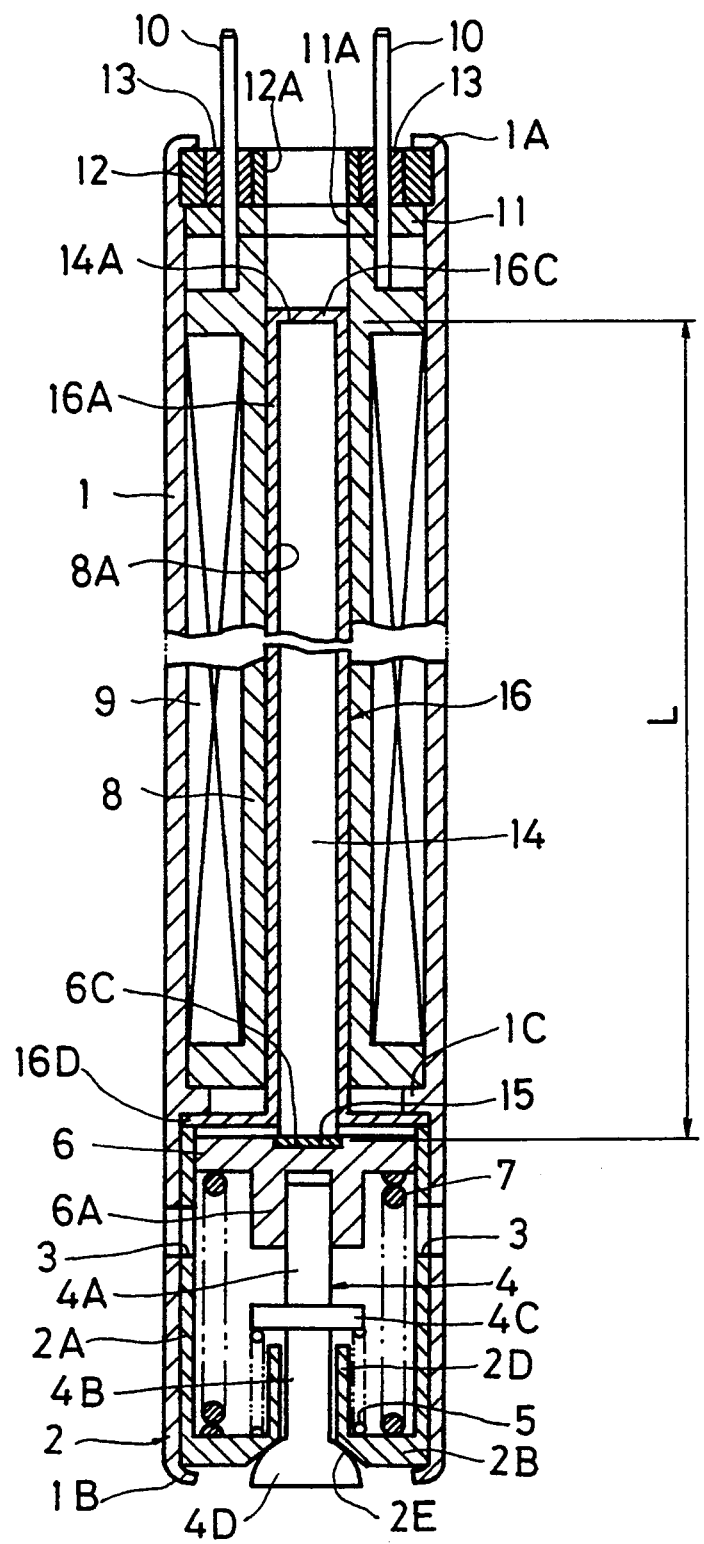
FIG. 1 is a longitudinal sectional view of a SMS type injection valve according to a first embodiment of the present invention.
Figure 2:
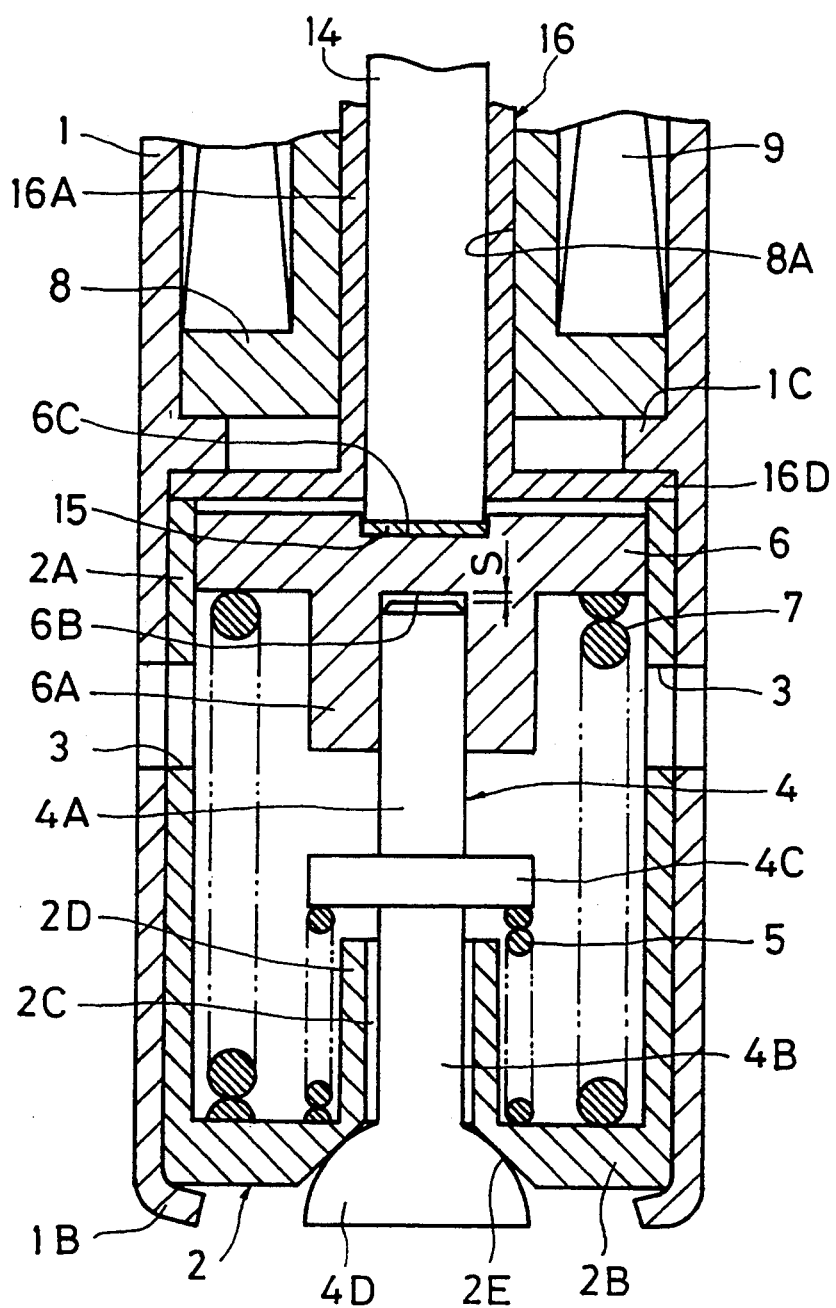
FIG. 2 is an enlarged view of a part of the valve of FIG. 1 showing the valve body.
Figure 3:
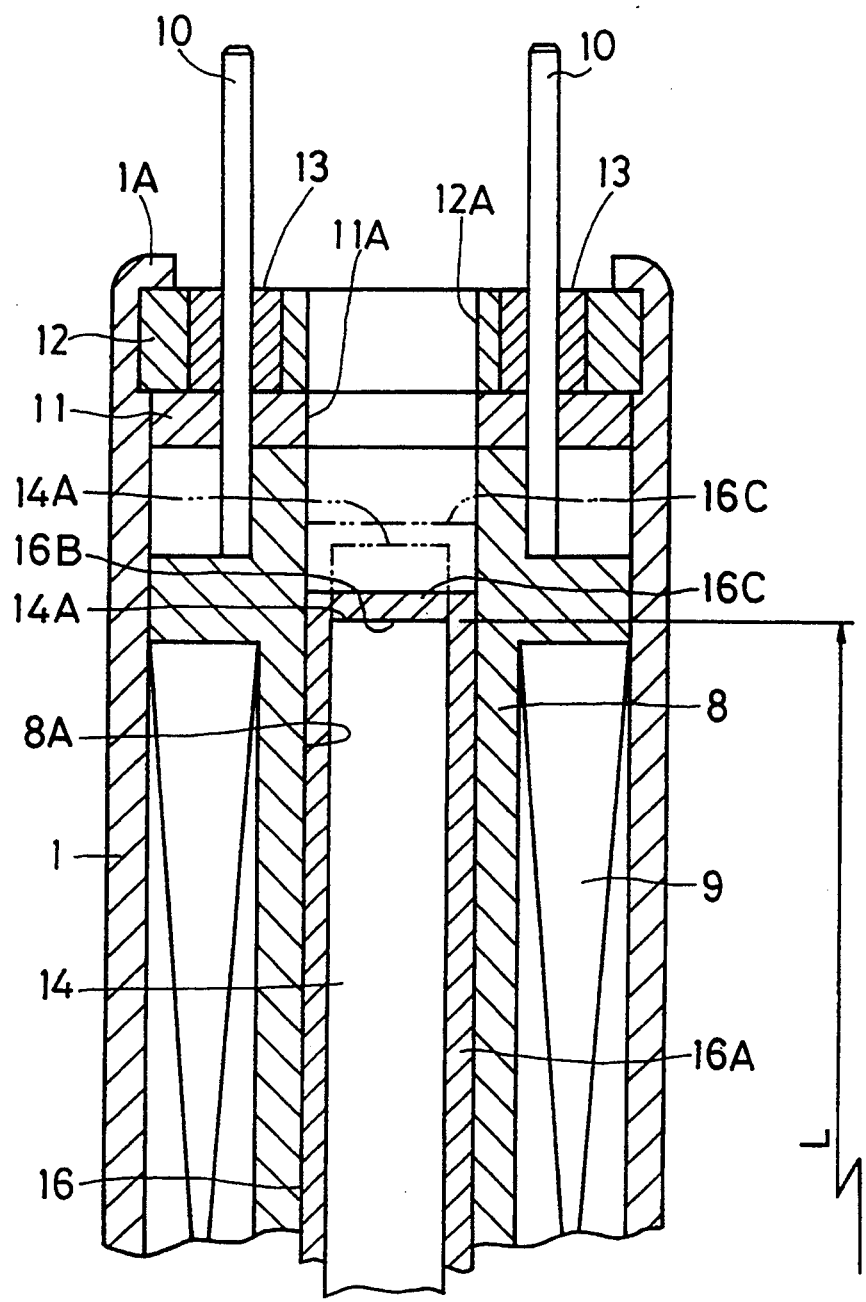
FIG. 3 is an enlarged view of another part of the valve of FIG. 1 showing an upper end of a SMS rod.

FIGS. 1-3 show a first embodiment of a SMS actuator according to the present invention.

In this embodiment, a hollow cylindrical casing 1 made of a magnetic material such as electromagnetic stainless steel is formed into a stepped cylindrical shape, with swaged portions 1A and 1B provided at respective top and bottom ends, and a protruding flange 1C provided on an interior peripheral surface at a predetermined distance above the swaged portion 1B.

An enclosed ended cylindrical shaped valve body 2 is provided on a lower inner peripheral side of the casing 1. As shown in more detail in FIG. 2, the valve body 2 comprises; a cylindrical portion 2A formed as a hollow cylinder having an outer diameter corresponding to the inner diameter of the casing 1, a relatively thick disk shaped base 2B extending radially inwards from a bottom end of the cylindrical portion 2A, a small diameter guide pipe 2D extending upwards from a central portion of the base 2B and having a plurality of axially aligned guide protrusions 2C, 2C, . . . formed on an inner peripheral face thereof in circumferentially spaced relation to one another, and a valve seat 2E positioned below the guide pipe 2D on an inner peripheral face of the base 2B with a taper shape widening outwards. A fuel injection opening is formed between the valve seat 2E and a valve portion 4D of a valve member 4 (to be discussed hereunder).

In this construction, the valve body 2 is provided as an integral unit engaged from its lower end, inside the casing 1 with the outer peripheral bottom face of the base 2B secured to the swaged portion 1B so that the upper end of the cylindrical portion 2A abuts with the protruding flange 1C through a flange portion 16D of a stopper pipe 16 acting as a locating member (to be discussed hereunder).

Fuel passages 3,3 which pass through the casing 1 are drilled radially in the cylindrical portion 2A of valve body 2. The fuel passages 3, 3 provide a passage for fuel from a fuel pump to flow via fuel piping (neither shown in the FIG.) into the valve body 2.

An externally opening valve member 4 (drive object) has a collar 4C formed thereon between an axially upper portion 4A and an axially lower portion 4B, and a hemispherical shaped valve portion 4D formed integral with the bottom end of the axially lower portion 4B.

The axially lower portion 4B of the valve member 4 passes inside the guide pipe 2D of the valve body 2, with the upper face of the hemispherical shaped valve portion 4D either separated from or seated on the valve seat 2E. A valve spring 5 is provided around the guide pipe 2D between the collar 4C of the valve member 4 and the base 2B of the valve body 2, so as to urge the valve member 4 in a normally closed direction.

With this arrangement, when the valve member 4 is opened against the valve spring 5 by a SMS rod 14 to be discussed hereunder, the fuel contained in the valve body 2 flows via the space between the respective guide protrusions 2C on the guide pipe 2D and is injected outwards from between the valve seat 2E and the valve portion 4D.

A spring seat 6 movably disposed inside the valve body 2 is provided with a downwardly protruding cylindrical protrusion 6A on a lower face thereof, which slidingly accommodates the axially upper portion 4A of the valve member 4.

A small gap "S" is provided between an upper face 6B of the cylindrical protrusion 6A and the upper end of the axially upper portion 4A to prevent separation of valve member 4D from the valve seat 2E with thermal expansion of the valve member 4. Without this small gap "S", the extension of the valve member 4 with thermal expansion acts in the valve opening direction under regulation of the SMS rod 14. However with the small gap "S" the extension is absorbed so that operation in the valve opening direction is avoided.

A shallow bottomed concavity 6C is formed in a central upper face of the spring seat 6. The lower end of the SMS rod 14 is engaged within this concavity 6C with a buffer plate 15 (to be discussed hereunder) disposed therebetween.

A setting spring 7 is provided around the cylindrical protrusion 6A of the spring seat 6, between the spring seat 6 and the base 2B of the valve body 2. The setting spring 7 together with the valve spring 5 constitute an urging device for urging the SMS rod 14 in a normally upward direction by way of the spring seat 6 etc., so as to provide an initial loading thereon.

A stepped cylindrical shaped coil bobbin 8 with a solenoid coil 9 wound therearound is provided inside the casing 1. The solenoid coil 9 is connected to terminal pins 10, 10 provided on the upper end of the coil bobbin 8, for excitation by an external electrical supply.

Application of a magnetic field to the SMS rod 14 by means of the solenoid coil 9, causes the SMS rod 14 to deform in an axial direction, thereby moving the valve member 4 in a direction to open the valve. An axially extending slide hole 8A defined by an inner peripheral face of the coil bobbin 8 is formed in the coil bobbin 8 and the stopper pipe 16 is inserted therein.

A cylindrical spacer 11 is disposed inside the casing 1 in abutment with an upper end of the coil bobbin 8, with a disk shaped cover 12 fixedly attached to the upper end of the casing 1, disposed thereabove. Small diameter cylindrical seal bodies 13, 13 are installed in the cover 12 around respective terminal pins 10 to seal against ingress of rain water and the like into the coil bobbin 8 from around the peripheries of the terminal pins 10.

The cover 12 is fixedly swaged in position by the swaged portion 1A in the casing 1, thereby locating the coil bobbin 8 and spacer 11 inside the casing 1 between the cover 12 and the protruding flange 1C. Respective through apertures 12A and 11A are formed on inner peripheries of the cover 12 and the spacer 11 in alignment with the slide hole 8A of the coil bobbin 8.

A thin cylindrical shaped SMS rod 14 made from a super magnetostriction material such as Neodymium (Nd) - iron mother alloy, Dysprosium (Dy)-iron, Terbium (Tb) - iron another alloy is positioned inside the slide hole 8A of the coil bobbin 8 by means of the stopper pipe 16. The SMS rod 14 is deformed axially by a magnetic field in the solenoid coil 9. For example with a magnetic intensity of 1kOe (Kilo Oersted) the SMS rod 14 is extended axially by 1,000 PPM $(1,000 \times 10^{-6})$ per unit length with respect to the total length L.

The SMS rod 14 has a coefficient of thermal expansion [$\alpha$] (coefficient of linear expansion) of approximately $1 \times 10^{-5}/°$ C. so that for each 1° C. increase in ambient temperature the SMS rod expands with respect to the total length L by an amount $L \times \alpha$.

The SMS rod 14 is axially located in the stopper pipe 16 with its upper end face 14A in abutment with a stopper portion 16C (discussed hereunder) of the stopper pipe 16, and with its lower end protruding a little in a downward direction from the open end of the stopper pipe 16 and accommodatingly engaged by way of the buffer plate 15 inside the concavity 6C of the spring seat 6.

The SMS rod 4 is normally urged in an upward direction by the setting spring 7 acting through the spring seat 6 so that the upper end is urged against the stopper portion 16C of the stopper pipe 16. The buffer plate 15 is made from a resilient resin material in the form of a disk of a predetermined thickness so that when the SMS rod 14 is extended to open the valve member 4, the buffer plate 15 dampens the impact of the valve member 4.

The stopper pipe 16 which is inserted together with the SMS rod 14 inside the slide hole 8A of the coil bobbin 8, is formed as a long thin cylinder from a similar SMS material to that of the SMS rod 14, having a corresponding coefficient of thermal expansion $\alpha$ corresponding to that of the SMS rod 14, but a negative magnetostriction characteristic (an opposite characteristic to that of the SMS rod). A cylindrical disk shaped stopper portion 16C with a flat contact face 168 as a lower face is formed integral with the upper end of the cylindrical portion 16A of the stopper pipe 16.

A large diameter flange portion 16D is formed integral with and protruding radially outward from the bottom end of the cylindrical portion 16A which comprises the open end of the stopper pipe 16. The outer periphery of the flange portion 16D is clamped between the protruding flange 1C of the casing I and the upper end of the cylindrical portion 2A of the valve body 2 so as to be fixedly attached to the casing 1.

The cylindrical portion 16A of the stopper pipe 16 has a longitudinal length including the thickness of the stopper portion 16C and the flange portion 16D which corresponds to the total length L of the SMS rod 14. Hence when the SMS rod 14 housed therein thermally expands axially, the cylindrical portion 16A expands by an axial amount corresponding to this expansion as shown by the hypothetical outline in FIG. 3. As a result the amount of thermal expansion of the SMS rod 14 is absorbed by the movement of the stopper portion 16C so that any axial change in position of the spring seat 6 due to the axial expansion of the SMS rod 14 is minimized.

Moreover, with the stopper portion 16C of the stopper pipe 16, the contact face 16B is in contact with the upper end face 14A of the SMS rod 4 over a relatively large contact area.

Since the stopper pipe 16 has a negative magnetostriction characteristic opposite to that of the SMS rod 14, it is contracted axially by the magnetic field from the solenoid coil 9. For example with a magnetic intensity of 1kOe (Kilo Oersted) the stopper pipe 16 is contracted axially by an amount [$\Delta$]L in a ratio of 1,000 PPM $(1,000 \times 10^{-6})$ per unit length with respect to the total length.

As follows is a description of the operation of a SMS type injection valve according to the present embodiment having the before mentioned construction.

Initially, an injection pulse such as that represented by the characteristic line 17 in FIG. 4($a'$) is fed to the solenoid coil 9 so as to apply a magnetic field to the SMS rod 14 and the stopper cylinder 16. As a result, the SMS rod 14 is extended and the stopper pipe 16 contracted in proportion to the strength of the magnetic field at the time. The SMS rod 14 thus extends in a downward direction from the flange portion 16D of the stopper pipe 16 so as to protrude by an amount of, for example twice the extension amount $\Delta L$ ($2 \times \Delta L$), thereby moving the spring seat 6 a significant amount in a downward direction by way of the buffer plate 15.

The SMS rod 14 thus lifts the valve member 4 in the downward direction by a large lift amount as shown by the characteristic line 18 in FIG. 4(b) which corresponds approximately to the before mentioned extension amount ($2 \times \Delta L$). The valve portion 4D is thus separated from the valve seat 2E so that the fuel contained in the valve body 2 is injected outwards from between the valve seat 2E and the valve portion 4D.

At this time, the upper end face 14A of the SMS rod 14 is in contact with the stopper portion 16C of the stopper pipe 16 so that upward positional change is restrained thereby. Hence, when the SMS rod 14 extends in a downward direction, it is also moved downward due to the contraction of the stopper pipe 16 so that the valve member 4 is opened by a larger lift amount against the setting spring 7 and the valve spring 5.

When the above super magnetostriction type injection valve is used as an injection valve for direct injection into a pipe, then even when pressure from inside a combustion chamber (not shown) acts on the valve member 4 from the outside, since the valve member 4 is an outward opening type valve member it remains pressed against the valve seat 2E, thereby preventing faulty opening of the valve member 4 prior to feeding an injection pulse to the solenoid coil 9.

With the thermal expansion of the SMS rod 14 as a result of heat from a combustion chamber and that generated in the solenoid coil 9, the upper end face 14A moves axially as shown by the hypothetical lines in FIG. 3.

If the upper end face 14A of the SMS rod 14 is substituted for the stopper portion 16C of the stopper pipe 16 however, then when this is fixed to the casing 1 by means of a cover member etc. as with the conventional technology, since the thermal expansion coefficient $\alpha$ of the SMS rod 14 is greater than that of the casing 1, and the upward extension of the SMS rod 14 due to the thermal expansion is restrained, the rod 14 extends in the downward direction.

With this extension, the valve member 4 is forced downward and in the worst situation, the valve portion 4D of the valve member 4 is unseated from the valve seat 2E so as to cause an unsatisfactory seal.

On feeding an injection pulse to the solenoid coil 9, the SMS rod 14 is extended, and during opening/closing of the valve member 4, the amount of thermal expansion of the SMS rod 14 is added to the extension. Hence the valve member 4 remains lifted in a valve open condition by a lift amount as shown by the characteristic hypothetical line 19 in FIG. 4(b).

With the present embodiment however, the stopper pipe 16 which acts as a locating member for the SMS rod 14, is made in cylindrical form from a super magnetostriction material having a coefficient of thermal expansion $\alpha$ corresponding to that of the SMS rod 14, and an opposite magnetostriction characteristic to that of the SMS rod 14. The length of the stopper pipe 16 is approximately the same as the total length L of the SMS rod 14, and the SMS rod 14 is located therein with its upper end face 14A pressed against the stopper portion 16C.

As a result when the SMS rod 14 thermally expands as shown by the hypothetical line in FIG. 3, the cylindrical portion 16A of the stopper pipe 16 also thermally expands in a similar manner. Hence the amount of thermal expansion of the SMS rod 14 is absorbed by the movement of the stopper portion 16C of the stopper pipe 16 and thereby offset. Upward extension of the SMS rod 14 due to thermal expansion is thus possible, and as well as preventing downward extension of the SMS rod 14, the contraction amount of the stopper pipe 16 and the extension amount of the SMS rod 14, when the solenoid coil 9 is energised for opening/closing the valve member 4, can be added together so that the valve member 4 can be opened and closed with twice the lift amount.

Accordingly, with the present embodiment, when the solenoid coil 9 is energised for opening/closing the valve member 4, the extension amount of the SMS rod 14 is added to the contraction amount of the stopper pipe 16 so that the lift amount of the valve member 4 can be doubled. Hence the SMS rod 14 and the stopper pipe 16 which are both made from a high cost SMS material can have a shorter overall length L, so that a compact super magnetostriction type injection valve is possible.

Furthermore the occurrence of poor sealing when closing the valve member 4, and the change in the spring loading of the setting spring 7, both due to the thermal expansion of the SMS rod 14 can be effectively prevented, and a constant initial loading on the SMS rod can be maintained.

Also, when the valve member 4 is expanded by heat from a combustion chamber, then even in this case, since the thermal expansion amount of the valve member 4 is absorbed by the small gap "S" shown in FIG. 2 formed between the axially upper portion 4A of the valve member 4 and the spring seat 6, any faulty separation of the valve portion 4D from the valve seat 2E can be prevented.

Moreover, when an injection pulse is fed to the solenoid coil 9 to open the valve member 4, the SMS rod 14 is extended by the resultant magnetic field causing the spring seat 6 to move in a downward direction against the setting spring 7, eliminating the small gap "S" and impacting against the axially upper portion 4A of the valve member 4. Direct transmission of the resultant impact shock at this time to the SMS rod 14 however is prevented by the buffer plate 15 so that the endurance of the SMS rod 14 can be improved.

With the above embodiment, the stopper pipe 16 is made from a super magnetostriction material having magnetostriction properties opposite to those of the SMS rod 14. However, if doubling of the lift amount is not required, the stopper pipe 16 may be made from a non magnetic material having a coefficient of thermal expansion corresponding to that of the SMS rod 14.

Figure 5:
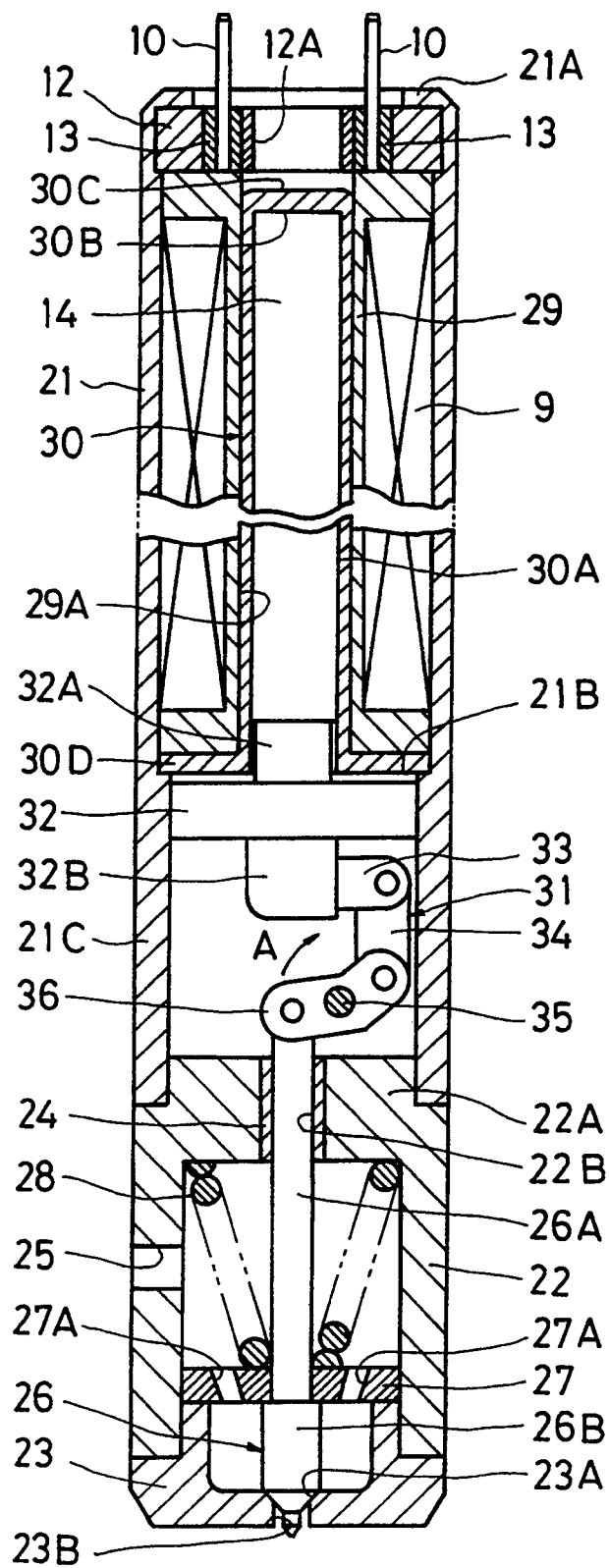
FIG. 5 is a longitudinal sectional view of an internally opening SMS type injection valve according to a second embodiment of the present invention.

FIG. 5 shows a second embodiment of the present invention wherein the actuator is applied to an internally opening type injection valve. In the second embodiment, structural elements similar to those of the first embodiment are indicated by the same symbols and description is omitted.

In this embodiment, a hollow stepped cylindrical casing 21 made of a magnetic material such as electromagnetic stainless steel is formed in a similar manner to the casing 1 of the first embodiment with a swaged portion 21A provided at an upper end thereof. However, the lower end of the casing 21 has a cylindrical shaped accommodating portion 21C provided below a circular step 21B.

A covered cylindrical shape valve body 22 is engagingly mounted on an inner peripheral side of the accommodating portion 21C of the casing 21, with a lower end thereof covered by a valve seat member 23 in which is formed a jet 23B having a valve seat 23A. A through hole 22B is formed in a central portion of a cover portion 22A on the valve body 22, and a valve shaft 26A (discussed hereunder) is passed through the through hole 22B so as to be slideably supported therein by means of a tubular seal member 24. A fuel passage 25 is drilled radially in the valve body 22, and provides a passage for fuel from a fuel pump to flow via fuel piping (neither shown in the FIG.) into the valve body 22.

An internally opening type valve member (drive object) generally indicated by arrow 26 is provided at tile bottom end of the casing 21. The valve member 26 comprises the valve shaft 26A passing through the through hole 22B in the valve body 22 so as to be slideably supported therein by means of the seal member 24, and a popper type valve head 26B formed integral with the bottom end of the valve shaft 26A, which seats/unseats on the valve seat 23A of the valve seat member 23. A disk shaped spring seat 27 is provided between the valve shaft 26A and the valve head 26B of the valve member 26, and a valve spring 28 which acts as an urging means to urge the valve member 26 in a normally closed direction, is provided between the spring seat 27 and the cover portion 22A of tile valve body 22. Flow passages 27A, 27A, . . . are formed at predetermined circumferential spacing in the spring seat 27 so as to provide passages under normal conditions from the interior of the valve body 22 to the interior of the valve seat member 23.

A stepped cylindrical shaped coil bobbin 29 formed in approximately the same manner as the coil bobbin 8 of the beforementioned first embodiment, is housed inside the casing 21, with a solenoid coil 9, and terminal pins 10, 10 connected to the solenoid coil 9 provided thereon. An axially extending slide hole 29A defined by an inner peripheral face of the coil bobbin 29 is formed in the coil bobbin 29 with a stopper pipe 30 discussed hereunder inserted therein.

The stopper pipe 30 which is inserted together with the SMS rod 14 inside the slide hole 29A of the coil bobbin 29, is formed as a long thin cylinder from a similar SMS material to that of tile SMS rod 14, having a coefficient of thermal expansion α corresponding to that of the SMS rod 14, but a negative magnetostriction characteristic. A cylindrical disk shaped stopper portion 30C with a flat contact face 30B as a lower face is formed integral with an upper end of a cylindrical portion 30A of the stopper pipe 30. A large diameter flange portion 30D is formed integral with and protruding radially outward from the bottom end of the cylindrical portion 30A which comprises the open end of the stopper pipe 30. The outer periphery of the flange portion 30D is clamped between the circular step 21B of the casing 21 and the coil bobbin 29 so as to be fixedly attached to the casing 21.

A position change transmission mechanism generally indicated by arrow 31 for transmitting a position change of the SMS rod 14 to the valve member 26 comprises; a disk shaped slide member 32 with boss portions 32A and 32B formed integrally on upper and lower faces thereof accommodated inside the accommodating portion 21C of the casing 21 so as to be slideable therein, a bracket 33 protruding in a radially outward direction from the boss portion 32B of the slide member 32, a transmission link 34 pinned to the bracket 33 and hanging downwards therefrom, and a pivot link 36 formed with an obtuse angled curve and mounted on a pin 35 in the accommodating portion 21C of the casing 21 so as to be pivotal thereabout, with one end thereof pinned to the transmission link 34, and the other end pinned to the valve shaft 26A of the valve member 26.

Here the boss portion 32A of tile slide member 32 is inserted into the cylindrical portion 30A of the stopper pipe 30 from the bottom end thereof so that when the stopper pipe 30 is fixed inside the casing 21, it exerts a predetermined load on the lower end face of the SMS rod 14. On energising the solenoid coil 9, the SMS rod 14 is extended and the stopper pipe 30 contracted so that the lower end of the SMS rod 14 moves a significant amount in the downward direction inside the stopper pipe 30, thereby pushing the slide member 32 together with the transmission link 34 downwards inside the accommodating portion 21C of the casing 21. As a result the pivotal link 36 is pivoted in the direction of the arrow A, and the valve member 26 is opened with a large lift amount against the valve spring 28.

With the second embodiment constructed in this manner, a similar operational effect to that of the first embodiment can be obtained. However in particular with the second embodiment, a position change transmission mechanism 31 is provided between the SMS rod 14 and the valve member 26 so that the contraction of the stopper pipe 30 can be added to the extension of the SMS rod 14, and the internally opening type valve can be opened/closed with a large lift amount. Hence the SMS rod 14 and the stopper pipe 30 which are both made from a high cost SMS material can be made shorter.

Now in the first embodiment, the valve member 4 and spring seat 6 were made separately. However as an alternative, the valve member 4 and spring seat 6 may be made as one. In this case the valve spring 5 may be omitted and the valve member 4 held in the normally closed direction by the setting spring 7.

Furthermore, in the above embodiments, the SMS rod 14 was made from a SMS material having a positive SMS characteristic, and the stopper pipe 16 (or 30) was made from one having a negative SMS characteristic. However, the present invention is not limited to this. For example, the SMS rod may be made from a SMS material having a negative SMS characteristic, and the stopper pipe made from one having a positive SMS characteristic so that when a magnetic field is applied to these, a valve member as a drive object may be opened/closed with a large lift.

Moreover, the SMS type actuator of the present invention is not limited in application to a SMS type fuel injection valve. For example the SMS type actuator may be used in place of an electromagnetic solenoid for a solenoid type on/off valve. In this case one end of the SMS rod may be attached to a drive object such as a spool valve or poppet valve. The actuator may also be applicable to disk brakes and the like. In this case, the construction may be such that the extension/contraction of the SMS rod is transmitted to a friction pad so as to apply a braking force to a disk.

What is claimed is:

1. A super magnetostriction type actuator comprising:
   a cylindrical casing,
   a super magnetostriction rod for driving a drive object which is provided at one end of said casing, said super magnetostriction rod being housed inside said casing and extending in an axial direction thereof with one end engaged with said drive object,
   a solenoid coil disposed inside said casing around said super magnetostriction rod, for applying a magnetic field to said super magnetostriction rod to cause an expansion or contraction thereof, and
   a locating member for locating an other end of said super magnetostriction rod, which thermally deforms in correspondence with a thermal expansion of said super magnetostriction rod in a direction to permit expansion of said super magnetostriction rod towards said other end, said locating member being made in hollow cylindrical form from a material having a coefficient of thermal expansion corresponding to that of said super magnetostriction rod and having an opposite magnetostriction characteristic to that of said super magnetostriction rod, said locating member having a sufficient length to accommodate an axial length of said rod, the construction being such that an open end of said locating member is fixed to said casing while an other end of said locating member is engaged with said other end of said super magnetostriction rod so that said super magnetostriction rod is located thereby.

2. A super magnetostriction type actuator as claimed in claim 1, wherein an urging means is provided at said one end of said casing, for urging said super magnetostriction rod towards an other end of said casing.

3. A super magnetostriction type actuator as claimed in claim 1, wherein said drive object is driven in an opposite direction to that of said magnetic field induced extension of said super magnetostriction rod.

4. A super magnetostriction type actuator as claimed in claim 1, wherein said drive object is driven by and in a direction of an extension of said super magnetostriction rod caused by said magnetic field, and a small gap to allow for axial thermal expansion of said drive object under non drive conditions of said super magnetostriction rod is interposed between said drive object and said super magnetostriction rod.

5. A super magnetostriction type actuator as claimed in claim 4, wherein a buffer member is provided between said super magnetostriction rod and said drive object.

* * * * *